(12) United States Patent
Kovacic et al.

(10) Patent No.: US 6,995,808 B2
(45) Date of Patent: Feb. 7, 2006

(54) TELEVISION TUNER

(75) Inventors: Stephen J. Kovacic, Ottawa (CA); Cormac M. O'Connell, Ottawa (CA)

(73) Assignee: SiGe Semiconductor Inc., Ottawa (CA)

( * ) Notice: Subject to any disclaimer, the term of this patent is extended or adjusted under 35 U.S.C. 154(b) by 596 days.

(21) Appl. No.: 10/053,603

(22) Filed: Jan. 24, 2002

(65) Prior Publication Data

US 2003/0137607 A1 Jul. 24, 2003

(51) Int. Cl.
*H04N 5/50* (2006.01)
*H04N 5/455* (2006.01)

(52) U.S. Cl. ............... 348/731; 348/720; 348/726; 348/731; 455/150.1; 455/179.1; 455/333

(58) Field of Classification Search ........ 348/720–721, 348/725–727, 731–733, 735, 737; 455/333, 455/150.1, 179.1; H04N 5/50, 5/455
See application file for complete search history.

(56) References Cited

U.S. PATENT DOCUMENTS

| | | | | |
|---|---|---|---|---|
| 5,737,035 | A * | 4/1998 | Rotzoll ................... 348/725 |
| 5,784,414 | A | 7/1998 | Bruekers et al. |
| 5,930,488 | A | 7/1999 | Mitsuishi |
| 5,999,793 | A * | 12/1999 | Ben-Efraim et al. ......... 725/68 |
| 6,091,931 | A * | 7/2000 | Ben-Efraim et al. ...... 455/3.02 |
| 6,118,499 | A * | 9/2000 | Fang ..................... 348/726 |
| 6,177,964 | B1 * | 1/2001 | Birleson et al. ........... 348/725 |
| 6,243,567 | B1 * | 6/2001 | Saito ..................... 455/188.2 |
| RE37,326 | E | 8/2001 | Kim |
| 6,286,065 | B1 | 9/2001 | Suzuki |
| 6,400,419 | B1 * | 6/2002 | Yamamoto ............... 348/731 |
| 6,501,513 | B1 * | 12/2002 | Nishimura et al. ......... 348/731 |
| 6,542,203 | B1 * | 4/2003 | Shadwell et al. .......... 348/726 |
| 6,675,003 | B1 * | 1/2004 | Dubash et al. ............ 455/302 |
| 6,714,604 | B1 * | 3/2004 | Tsurumi et al. ............ 375/329 |
| 6,725,463 | B1 * | 4/2004 | Birleson .................. 725/151 |
| 6,765,626 | B1 * | 7/2004 | Tanaka ................... 348/725 |
| 2002/0005912 | A1 * | 1/2002 | Yanagi et al. ............. 348/725 |
| 2002/0121679 | A1 * | 9/2002 | Bazarjani et al. .......... 257/666 |
| 2004/0061804 | A1 * | 4/2004 | Favrat et al. ............. 348/554 |

* cited by examiner

*Primary Examiner*—Brian P. Yenke
(74) *Attorney, Agent, or Firm*—Freedman & Associates (57) ABSTRACT

A front end tuner for receiving TV signals and the like includes a frequency conversion circuit including a mixer for beating a local signal with received signals within a predetermined band of frequencies to provide selected signals within a predetermined band of frequencies to provide selected signals within a predetermined channel band of frequencies. A signal converter circuit generates digitally encoded signal representations of the selected signals. The frequency conversion circuit and the signal converter circuit are in a form of an integrated circuit within a semiconductor substrate. In a TV receiver, on-following digital processing of the digitally encoded signals is performed in a microcomputer. In one example a channel selection code is used by the microcomputer to synthesize the local oscillator signal and in another example the signal converter circuit is a codec, responsive to codes from the microprocessor, to supply a control voltage for controlling a local oscillator. From time to time channel selection is automatically fine tuned.

20 Claims, 7 Drawing Sheets

PRIOR ART

TELEVISION TUNER

The invention is in the field of signal receivers and more particularly relates to tunable receivers for selecting and receiving television signals and the like.

BACKGROUND OF THE INVENTION

Television receivers have evolved and improved over the years since being first available as a consumer purchasable item, however the standards of frequency allocations and signal formats have remained virtually constant. A manufacturer will either manufacture and or purchase subassemblies having been manufactured elsewhere, preparatory to the final assembly of each television set. In North America for example, a family of internal electrical standards or preferences evolved such that a subassembly manufacturer might supply an elemental circuit for any of different television sets. Such subassemblies are compatible with input and output parameters of frequency, signal amplitudes and signal formats. Thus any given set design may be assembled with any of various subassemblies having been supplied from any of various manufactures. A manufacture specializing in a particular subassembly may supply several different set assemblers and hence is often able to volume manufacture such subassembly at a lesser cost than would a set assembler. If one is to observe the circuit elements of a television receiver one will usually find parts such as, circuit boards, discrete components and integrated circuits identified with trademarks of various manufacturers.

Decades ago, before cable distribution of television program signals became common, television receivers were limited to receiving any one of at most 12 channels which occupy two bands of frequency, a lower band of 54 to 88 MHz and an upper band of 174 to 216 MHz. Each channel was received by a dedicated RF filter paired with a corresponding tank circuit, one pair of which being selected by manual rotation of a so called turret tuner. The RF filtered incoming signal was converted to an intermediate frequency typically at about 43 MHz, by a mixer driven from a local oscillator which was controlled by the corresponding tank circuit. An active band pass filter referred to as an intermediate frequency (IF) strip amplified the converted signal before video, and audio, detection and on following signal processing.

Recently advances in the manufacture of analog integrated circuits have revolutionized the manufacture of colour television receivers. Even more recently advances in the operating speeds of digital circuits, for example digital signal processors (DSPs), memories, microprocessors, analog to digital converters and codecs and the ever lower costs of these circuit elements, have spurred their use in applicable areas of television receivers. As well as cost benefits, improvements in picture display and sound reproduction have accrued. Consequently cost reductions have facilitated practical supply entry of high definition television (HDTV) receivers into the high end of the retail consumer market. Never the less realization of the dream of providing the whole of the electronics in a single integrated circuit remains ever elusive. For example analog circuit elements and digital circuit elements do not integrate easily in a single circuit substrate. Optimal circuit production yield and performance entertain dissimilar geometries, doping and processing requirements, which are virtually mutually exclusive. The requirements of signal reception dictate analog circuit functionality to derive a relatively constant signal, which may be processed by digital circuitry. Integrated digital circuitry ultimately provides digital composite video and digital composite audio signals for display and reproduction. The operating requirements of cathode ray tube operation and sound reproduction ultimately require relatively high power circuitry of an analog nature. Hence the modern television receiver yet includes a multiplicity of integrated and discrete devices often produced at several different sources and typically compatible with long established signal formats.

Figure 1:
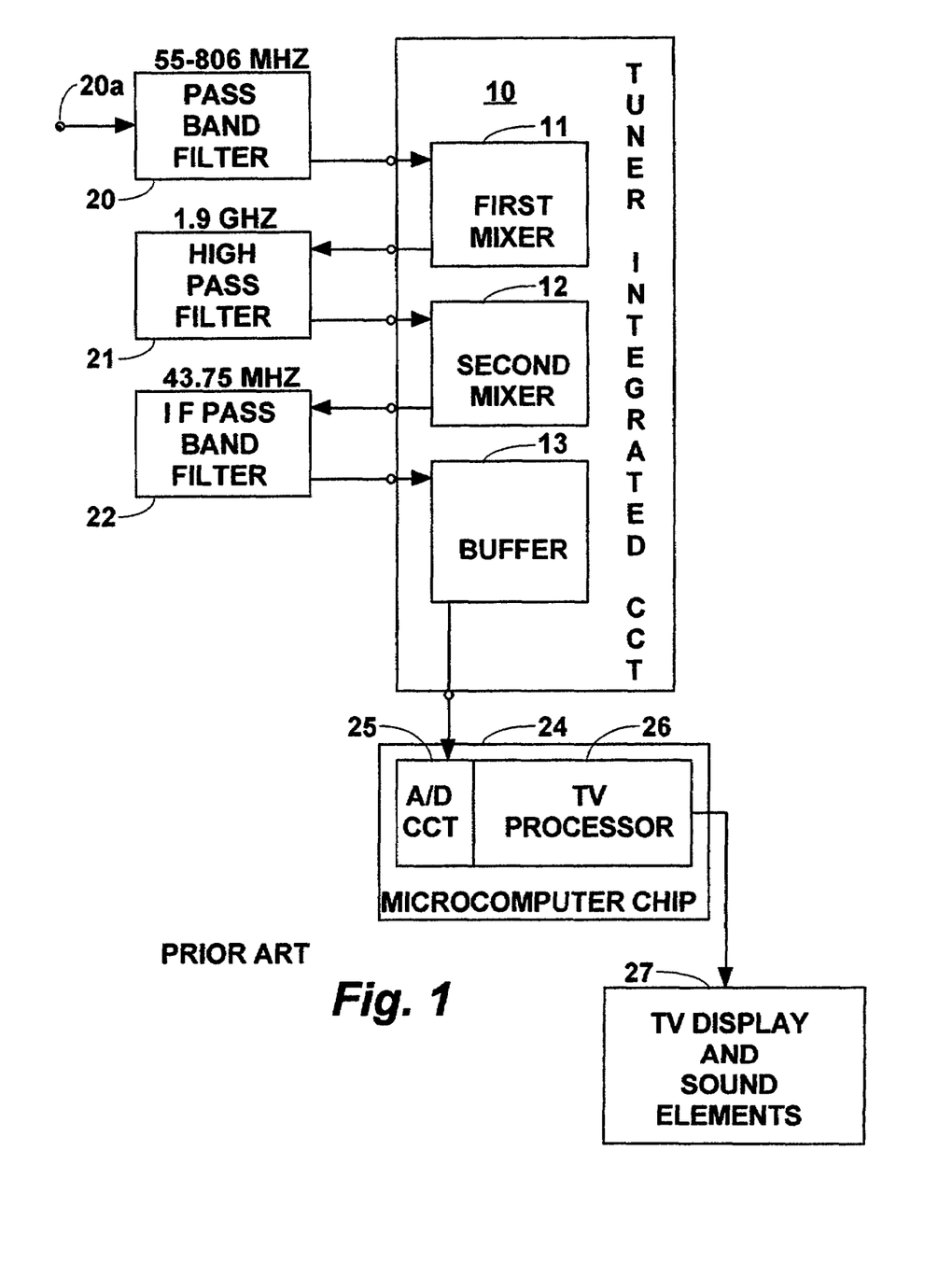
FIG. 1 is a schematic block diagram broadly illustrating an example of typical state of the art television receiver.

FIG. 1 is a block schematic diagram of a typical example of a state of the art television receiver. A pass band filter 20 passes signals appearing at its input 20a and having frequencies in a range of 55–806 MHz, to an integrated tuner circuit chip 10. A first mixer 11 mixes a variable frequency local signal having a frequency of between 1.094–1.845 GHz selected to up convert a desired channel frequency from the band pass filter 20 to generate a sum signal frequency centred on 1.9 gigahertz. A channel pass band filter 21 receives the output of the first mixer 11 and attenuates all but those signals of frequencies in the desired channel. A second mixer 12 in the integrated circuit chip 10 mixes a fixed local signal with signals from the band pass filter 21 to down convert these signals to about 43.75 MHz, the traditional standard intermediate frequency. By so doing the buffer 13 is able to amplify signals, passed by an IF pass band filter 22, and provide the amplified signals for video, and audio, detection and on following signal processes. The standard intermediate frequency output from the integrated tuner chip permits the use of virtually any typical TV industry circuitry. One or more of the filters, 20, 21, and 22 is usually a discrete element such as a surface acoustic wave (SAW) device. Although this necessitates off chip connections at considerable expense by means of beam leads or the like, the performance advantages of one or more off chip filters is usually required.

The detection and following signal processing, in FIG. 1, are exemplified as being performed by a TV processor 26 in a microcomputer chip 24. An analog to digital converter circuit 25, in a microcomputer chip 24, provides digital signals representing quantitized samples of the down converted signals from the buffer amplifier 13. The digital signals are in a preferred form for the on-following signal processing which is effected by a TV processor 26 preparatory for utilization by TV display and sound reproduction elements 27.

Although the TV industry spans many decades the introduction of digital TV processors is a relatively recent event. Examples of receivers are published in U.S. Pat. No. 6,177,964 issued to Birlson et al, wherein an analog integrated circuit tuner with several off chip filter devices is intended to provide a picture carrier at 45.75 MHz. On following analog processing circuitry may be included or separate digital processing circuitry is mentioned as an alternative.

Other examples of HDTV receivers are published in U.S. Pat. No. RE37,326, issued to Kim, wherein an analog integrated circuit tuner utilizing an IF SAW filter is intended to provide a 44 MHz output. The design of the SAW filter is simplified by further filtering by a VSB filter. The VSB filter is exemplified as being a FPLL circuit that produces quadrature I and Q outputs which are subsequently sampled at a 10.76 MHz rate and converted to digital signals. The digital signals are square root raised cosine (SCR) filtered and then subtracted one from the other to provide a digital composite video signal.

Of interest, in the U.S. Pat. No. 5,784,414, Bruekers et al are concerned with power consumption of high speed digital circuit elements in a receiver of signals in the FM and or TV broadcast bands. They teach a particular digital circuit design which reduces the required speed of operation and achieves a corresponding reduction in power consumption. Although Bruekers et al have little to offer as to a preferred form of circuit structure, the commercially viable choice is that of one or several integrated circuits. More recently, U.S. Pat. No. 5,930,488, entitled SEMICONDUCTOR INTEGRATED CIRCUIT DEVICE WITH A DATA TRANSFER CONTROLLER AND A MEMORY STORING DATA TRANSFER PARAMETERS, teaches a single chip microcomputer which includes an A/D converter. Even more recently, U.S. Pat. No. 6,286,065, titled MICROCOMPUTER HAVING A BUILT-IN A/D CONVERTER WITH A RESISTOR BETWEEN AN EXTERNAL TERMINAL AND AN I/O CIRCUIT, teaches cost reduced structures by virtue of having one less external terminal.

As digital TV processors are highly specialized apparatus and are expected to be serving a vast market place, it is expected that digital TV processors will experience accelerated development. Various TV processors will likely be based in solid state technologies not strictly limited to the currently popular complimentary metal oxide silicon (CMOS) based microcomputers and digital signal processors. Reductions in size, power consumption and cost, will be accompanied by improvements in speed and TV signal processing functionality. Presently microcomputer integrated circuit chips which accept an analog signal input include at least one A/D converter circuit. In contrast to the exclusively digital circuits of the digital TV processor 26, the A/D converter circuit 25 includes analog circuit elements as well as digital circuit elements. The analog circuit elements by virtue of their physical characteristics, determine the function speed and accuracy of the A/D conversion process. Hence anything less than the optimal circuit element geometries and the optimal analog integrated circuit manufacturing processes can result in less than optimal digitization and thus jeopardize the overall TV receiver's functionality. Developers of integrated circuit designs tend to specialize exclusively in only one of two disciplines, either analog or digital. Cooperation between these disciplines often boarders on the impractical. Furthermore fabrication processes optimized to digital circuit manufacture are in essence mutually exclusive of fabrication processes optimized to analog circuit manufacture. These contrasts between the digital and analog technologies are a serious impediment to the expeditious future development of digital TV processors.

A solution to this impediment is envisaged wherein the typical limitation of a 40 MHz or so analog interface between a tuner and on following processing circuitry is removed and a digital signal interface provided in its place. This permits the processing circuitry chip to be more conveniently provided exclusively by digital circuitry elements. Conversion of information, received by the tuner in a modulated analog carrier signal, is provided by an analog to digital A/D converter and is transferred to the microcomputer either on a periodic basis or on an interrupt basis, for example. The A/D converter is advantageously manufacturable in integrated circuit form within the integrated TV tuner circuit chip. As the digital circuit elements of the A/D converter 25 are relatively of little bulk, characteristics of optimized smallness and miserly power consumption are relatively insignificant. Hence digital circuit geometries can be utilized to provide for satisfactory digital circuit functionality in spite of being produced by preferred analog circuitry manufacturing processes.

SUMMARY OF THE INVENTION

Any developer of integrated circuit TV processors will have a significant advantage if the functionality of the microcomputer integrated circuit chip is strictly limited to digital functions performed by digital circuit. By so doing, the developer avoids difficulties of mixing analog and digital circuitry elements such that improvements in TV signal processors can be more rapidly brought to the consumer market place. Hence it is in the interest of developers and manufactures of television front end tuners and the like to include the A/D conversion circuit, or alternately a codec, within an integrated circuit chip along with the front end tuner elements. There will be a ready market for tuners which provide digitized output signals.

In accordance with an aspect of the invention, a front end tuner for receiving modulated signals selected in accordance with a frequency characteristic thereof provides a digital output signal being representative of the selected signals. The front end tuner includes a frequency conversion circuit having a mixer for beating a local oscillator signal with signals within a predetermined band of frequencies and thus generates signals having frequencies within a predetermined channel band of frequencies. A signal converter circuit receives the signals having frequencies within the channel band of frequencies from the frequency conversion circuit and generates digitally encoded signal representations of the received signals. The frequency conversion circuit and the signal converter circuit are in a form of an integrated circuit within a semiconductor substrate. The integrated circuit is connected with an external input terminal for receiving the signals within said predetermined band of frequencies, and connected with an external output terminal for transmitting said digitally encoded signal representations.

In one example the signal converter circuit is a codec having bidirectional digital signals input/output coupled with the second external terminal. The codec decodes a coded signal received from the second external terminal to provide a variable voltage signal of a corresponding voltage value. The integrated front end tuner further includes a local oscillator for generating the local oscillator signal at a frequency being controlled by the voltage value.

In accordance with another aspect of the invention, a receiver for receiving a modulated carrier signal of a frequency within a predetermined range of frequencies includes, a plurality of filter devices including a first filter having a pass band for passing signals of frequencies within the predetermined range of frequencies with lesser attenuation than signals of other frequencies, and a second filter having a pass band limited to a channel range of frequencies consistent with passing information signals representative of the modulated carrier signal. A frequency conversion circuit includes a mixer for beating a local signal with signals passed by the first filter to generate signals being representative of said modulated carrier frequency signal at frequencies within the channel range of frequencies for pass filtering by the second filter. A signal converter circuit generates digitally encoded signal representations of any signals passed by the second filter and includes a signal port for providing the digitally encoded signal representations.

At least the frequency conversion circuit and the signal converter circuit are in a form of an integrated circuit within a semiconductor substrate and the integrated circuit is connected with an external terminal for transmitting the digitally encoded signal representations.

In one example the receiver is a TV receiver including a TV processor within a microcomputer chip, coupled to receive said digitally encoded signal representations, TV display and sound elements coupled with the TV processor and a frequency synthesizer. The frequency synthesizer includes an output coupled with the integrated circuit for providing the local signal to the frequency conversion circuit. The frequency synthesizer is responsive a code from the TV processor for generating the local signal at a frequency to facilitate said pass filtering of said signals being representative of said modulated carrier frequency signal. Advantageously, the frequency synthesizer may also reside within the microcomputer chip.

A method in accordance with an aspect the invention provides for channel selection in a TV receiver having an integrated circuit tuner including, a mixer for mixing an analog local signal with received signals, and an analog to digital signal converter for providing digitally encoded signal representations of selected channel signals; and the TV receiver further having a microcomputer chip including a TV processor for accepting command signals from a TV user and for processing the digitally encoded signal representations, preparatory to video display and audio reproduction by TV display and sound elements in the TV receiver, the method comprising the steps of:
  a) generating a command code signal in response to a channel selection command signal from the TV user;
  b) digitally synthesizing the local signal in response to the command code signal, to effect reception of the selected channel signals;
  c) from time to time determining a difference between a variable parameter of the selected channel signals and a predetermined parameter and modifying the command code signal toward reducing the difference.

Another method, in accordance with an aspect the invention, provides for channel selection in a TV receiver having an integrated circuit tuner including, a mixer for mixing a local signal with received signals, and a codec for providing digitally encoded signal representations of selected channel signals; and the TV receiver further having a microcomputer chip including a TV processor for accepting command signals from a TV user and for processing said digitally encoded signal representations, preparatory to video display and audio reproduction by TV display and sound elements in the TV receiver, the method comprising the steps of:
  in the microcomputer chip, generating a command code signal in response to a channel selection command signal from the TV user;
  in the codec, providing the analog local signal in response to the command code signal; and
  in the microcomputer chip, from time to time fine tuning the command code signal by determining a difference between a variable parameter of the selected channel signals and a predetermined parameter and modifying the command code signal toward reducing the difference.

BRIEF DESCRIPTION OF THE DRAWINGS

Example embodiments are discussed with reference to the accompanying drawings in which:

FIG. 3 is a schematic block diagram illustrating an example of a variation of the television receiver of FIG. 2a;

FIG. 4 is a schematic block diagram illustrating an example of an other variation of the television receiver of FIG. 2a;

DETAILED DESCRIPTION

Figure 2A:
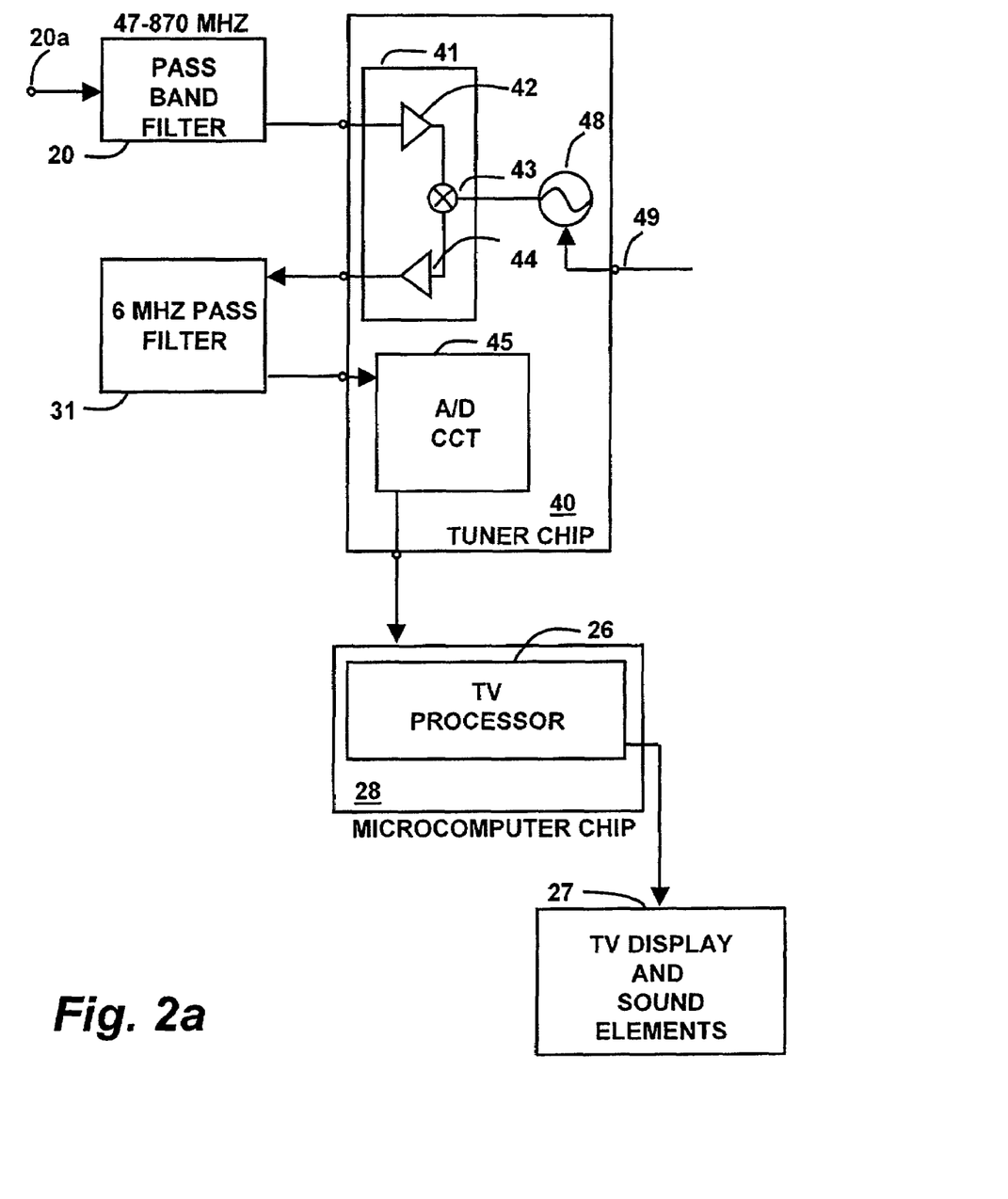
FIG. 2a is a schematic block diagram illustrating an example of a television receiver in accordance with the invention.
Figure 2B:
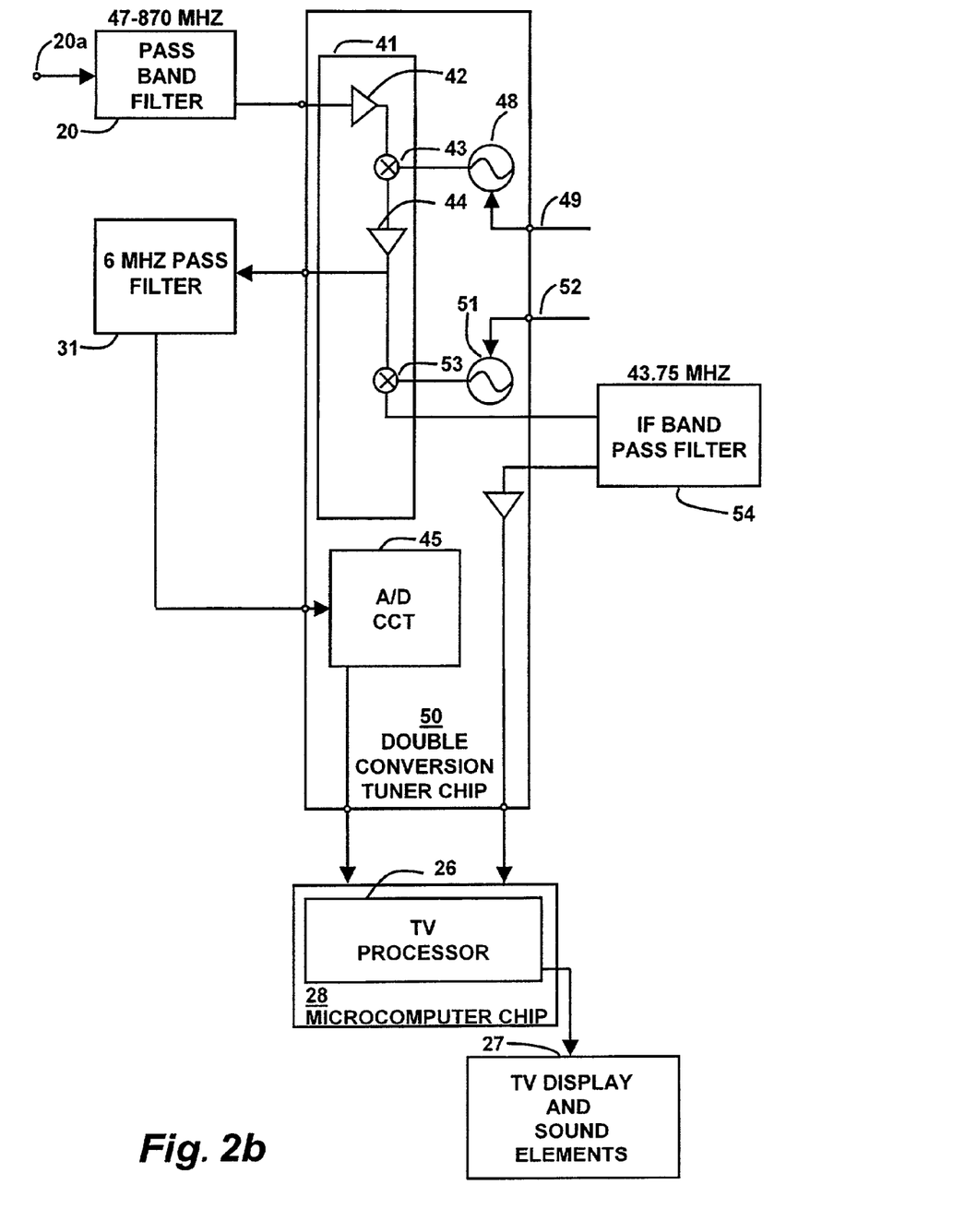
FIG. 2b is a schematic block diagram illustrating an example of a television receiver, using a double conversion tuner, in accordance with the invention.

In the FIGS. 1 and 2, the TV receiver is depicted without illustration of mechanical structure, user interface, control apparatus and provision of energizing power. These features of television receivers are generally well known and are not farther mentioned unless such may be beneficial to an understanding of the invention. Furthermore those elements of substantially similar structure and function in the various drawings are similarly labelled.

Although discussed in the forgoing, by way of reminder it is noted that in the typical TV receiver as shown in FIG. 1, the microcomputer chip 24 is an integrated circuit, the bulk of which provides the TV processor 26. One of the advantageous of the TV processor 26 is that it consists solely of digital circuit elements. The A/D circuit 25 converts IF analog signals from the tuner integrated circuit 10. The IF analog signals are converted to corresponding digital signals for processing by the TV processor 26. The A/D circuit 25 includes essential analog circuitry, which although seemingly insignificantly small in bulk as compared with the digital circuitry of the chip 24, the analog circuitry of the A/D circuit disproportionately complicates and compromises the design and manufacture of the microcomputer chip 24. In contrast, as illustrated in FIG. 2a, the A/D circuit is integrated in an analog circuit environment in a tuner chip 40, thus freeing the microcomputer chip from analog circuitry and the accompanying constraints and compromises.

In FIG. 2a, the television receiver includes a tuner chip 40 for supplying digital representations of a TV signal to a microcomputer chip 28 which includes the TV processor 26 for processing the TV signal preparatory to visible and audible presentation, via TV display and sound elements 27. The microcomputer chip 28 consists solely of digital circuit elements.

The tuner chip 40 is an integrated circuit manufacturable in accordance with any preferred analog integrated circuit technology. External connections and or beam lead connections with elements in the tuner chip are expensive and by design are minimized. Each of the illustrated external or beam lead connection with the tuner chip 40 is indicated in the drawings by a hollow dot. The tuner chip 40 includes a frequency conversion circuit 41, an analog to digital (A/D) converter circuit 45 and a local oscillator 48. The frequency conversion circuit 41 basically includes a low noise amplifier (LNA) 42, a mixer 43 and a buffer amplifier 44. In this example it is preferred that the mixer 31 be a balanced mixer.

In operation, any signals passed from an input terminal 20a, via a band pass filter 20, are amplified by the LNA 42 and applied to a terminal of the mixer 43. Automatic gain control circuitry, not shown, may be used to regulate the amplification of the LNA 42 so that it will not be overdriven in the presence of strong signals at the input terminal 20a. The local oscillator 48 is responsive to a control signal, on a lead 49, for supplying a local oscillator signal, to the mixer 43, at a selected frequency. A mixed signal from the output of the mixer 43 is transferred, by the buffer amplifier 44, to a 6 MHz band width pass filter 31 which attenuates signals outside of a 6 MHz channel. Any signals with frequencies within the pass band are transmitted to the A/D converter circuit 45. The A/D converter circuit 45 provides encoded digitized samples of the passed signals at a rate of at least twice that of the highest frequency required to be passed by the pass filter 31. The encoded digitized samples are passed from the tuner chip 40 to the microcomputer chip 28 which prepares signals for operation of the TV display and sound elements 27, based on information having been encoded in the digitized samples.

The design of the A/D converter circuit 45 includes some digital circuitry for briefly storing digital information prior to it being transferred to the microcomputer chip 28. A/D converter designs are available wherein the extent of the digital portion is preferably minimized, however such is not essential to the manufacture and operation of the tuner chip 40 in any of the example embodiments. Of course the particular design of the A/D converter 25 is consequent upon a form of the digital signal output required from the A/D circuit 45. The form of the digital output signal may be chosen according to that which is convenient for the operation microcomputer chip 28, having consideration for the minimum Nyquist sampling rate required for encoding signals from the pass filter 31.

For example the 6 MHz channel of the pass filter 31 may be readily centred in a surface acoustical wave (SAW) device at about 500 MHz, to select a mixed difference signal from the balanced mixer 43. The local oscillator 48 is controlled by a capacitance diode, biased by a voltage on the lead 49, to supply a local oscillator signal of a selected frequency in a range of 547–1370 MHz. In this example, the minimum sampling rate at which the A/D converter circuit 45 must operate is over 1 GHz. If linear encoding were to be used to generate at least 13 bit encoded samples, a serial digital signal output bit rate of more than 13 GHz would be required. This serial output rate could be impractical. One solution is substituting a parallel output bus for the serial output, however the added expense, of a multitude of external terminals renders such a solution impractical. More likely, a differential or so called delta encoding signal format, yielding a serial bit rate of no more than twice the sampling rate, would be practical.

In FIG. 2b, a more expensive variation is shown. A double conversion tuner chip 50 requires an additional local oscillator 51 and mixer 53, as well as an additional filter 54 to generate a channel signal at a reduced carrier frequency. Consequently the input sampling rate and the serial bit rate of the output of the A/D converter circuit 45 are correspondingly reduced.

Figure 3:
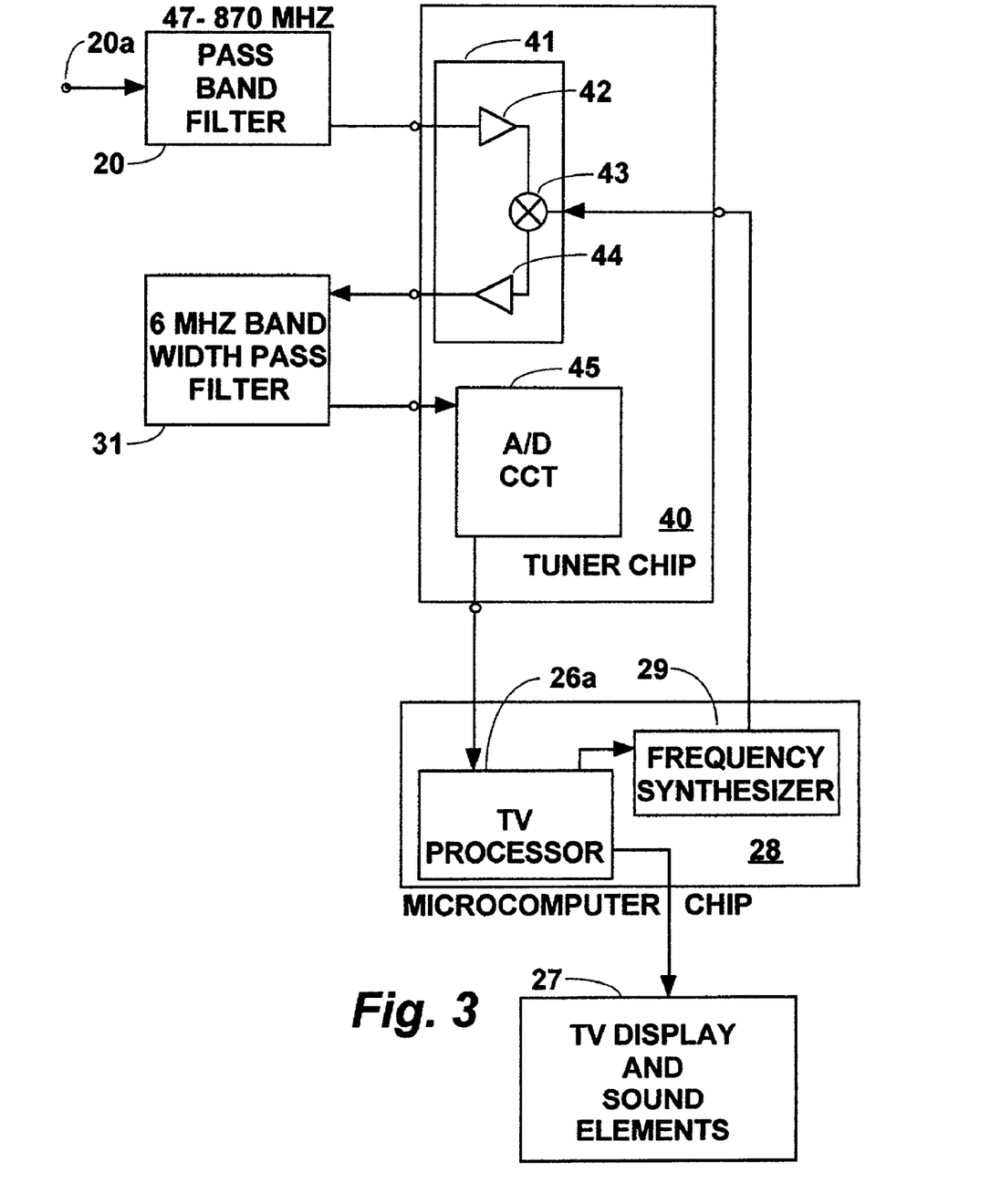

In another example, as illustrated in FIG. 3, the 6 MHz channel of the pass filter 31 may be readily centred at about 10 MHz. The frequency conversion circuit 41 provides difference signals representing a selected channel from the balanced mixer 43 in response to a local oscillator frequency selected from a range of frequencies of 37–860 MHz. The local oscillator must operate over a range spanning more than 5 octaves. As a capacitance diode oscillator operational over several octaves is difficult to provide, the local oscillator signal is generated by a digital frequency synthesizer 29 in the microprocessor chip 28. A minimum sampling rate of the A/D converter circuit 45 is about 20 MHz. Linearly encoded samples producing 14 bit words would produce a more modest serial bit rate of 280 MHz. Nonlinear encoding such as a standard pulse code modulation (PCM) can be used to further reduce the serial bit rate while yet retaining the information content of each sample.

Figure 6:
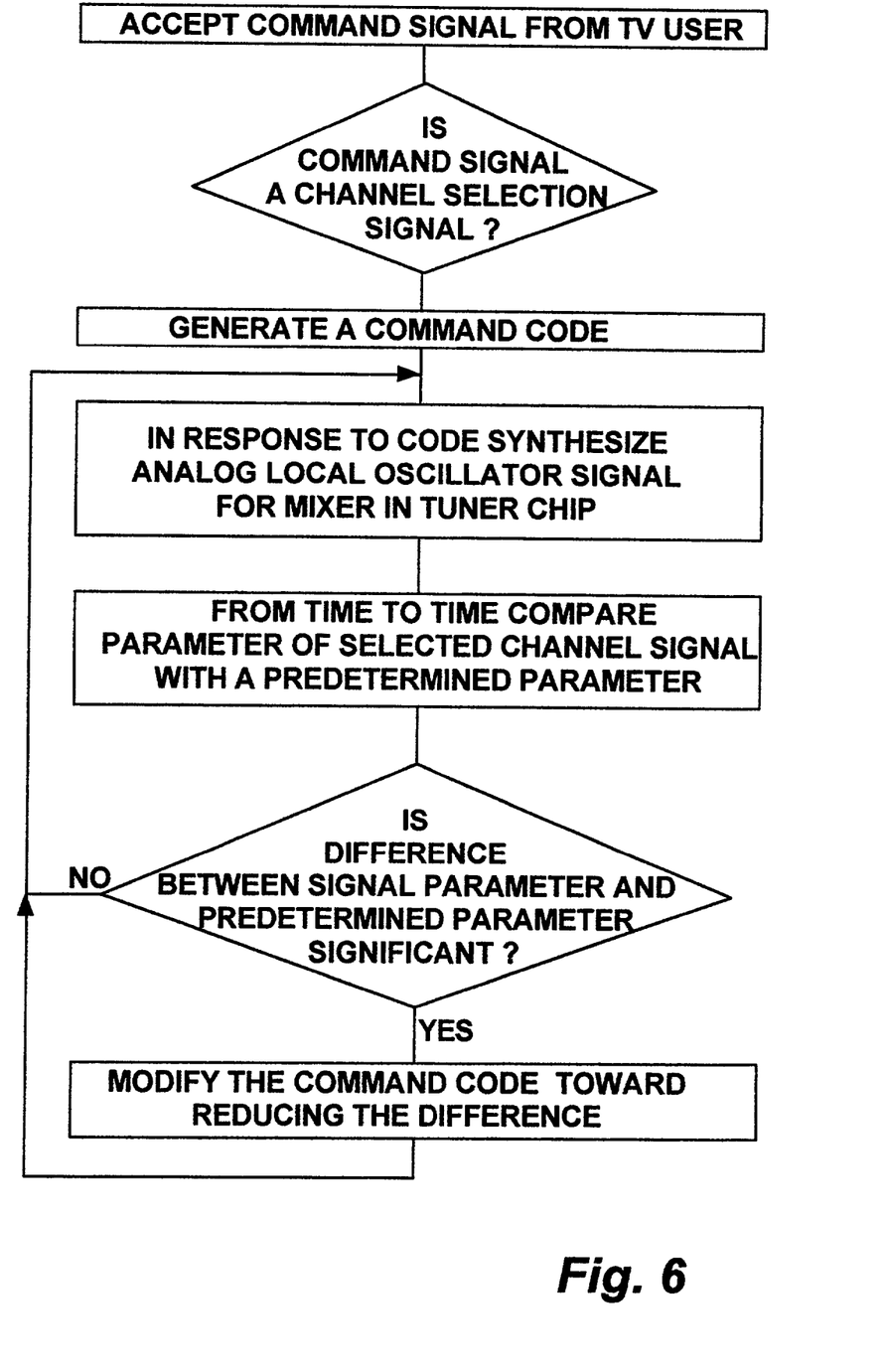
FIG. 6 is a flow chart diagram illustrating functions related to provision of a local oscillator signal in a television receiver as illustrated in FIG. 3.

Further considering FIG. 3 also with reference to FIG. 6, in operation the TV processor 26a is responsive to user control signals (not illustrated) such that a person is able to select a television channel for viewing. If a control signal indicates a selected channel, it is translated into a corresponding control code and coupled to the frequency synthesizer 29. The frequency synthesizer 29 relies upon a local clock signal provided in the normal function of the microcomputer chip 28 to generate a local oscillator signal for use by the frequency conversion circuit 41. However, the frequency of a local clock signal, so provided, although fairly consistent is often inaccurate and consequently the local oscillator signal is likewise inaccurate. To compensate during reception of a selected channel, the TV processor 26a compares a characteristic, of the received TV signal as represented by the digitized signal samples, with a preferred parameter. The preferred parameter may be the picture frame rate for example, or some other characteristic which is independent of the effects of frequency conversion. Any significant difference is useful for amending the digital control code. From time to time the TV processor 26a transmits an amended or modified digital control code to effect fine tuning of the frequency of the frequency synthesizer 29 such that the TV receiver more optimally receives the selected channel.

In a variation of the TV receiver illustrated in FIG. 3, the local oscillator signal frequency corresponds to the frequency of a selected carrier frequency so that the balanced mixer 43 performs a direct conversion to baseband. The pass filter 31 and the A/D converter, operate at base band with a serial output bit rate of the A/D converter circuit 45 being likewise reduced.

Figure 4:
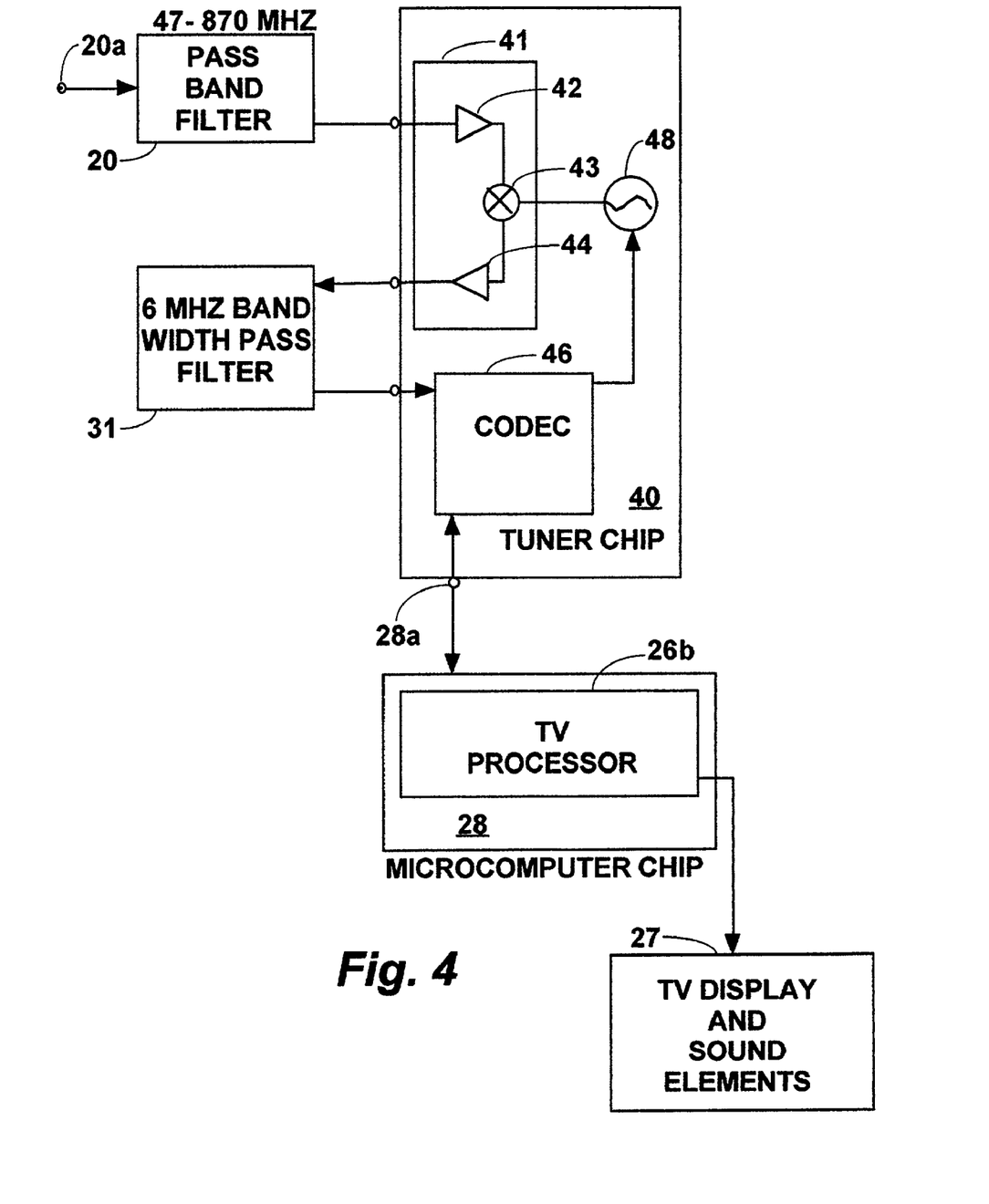
Figure 5:
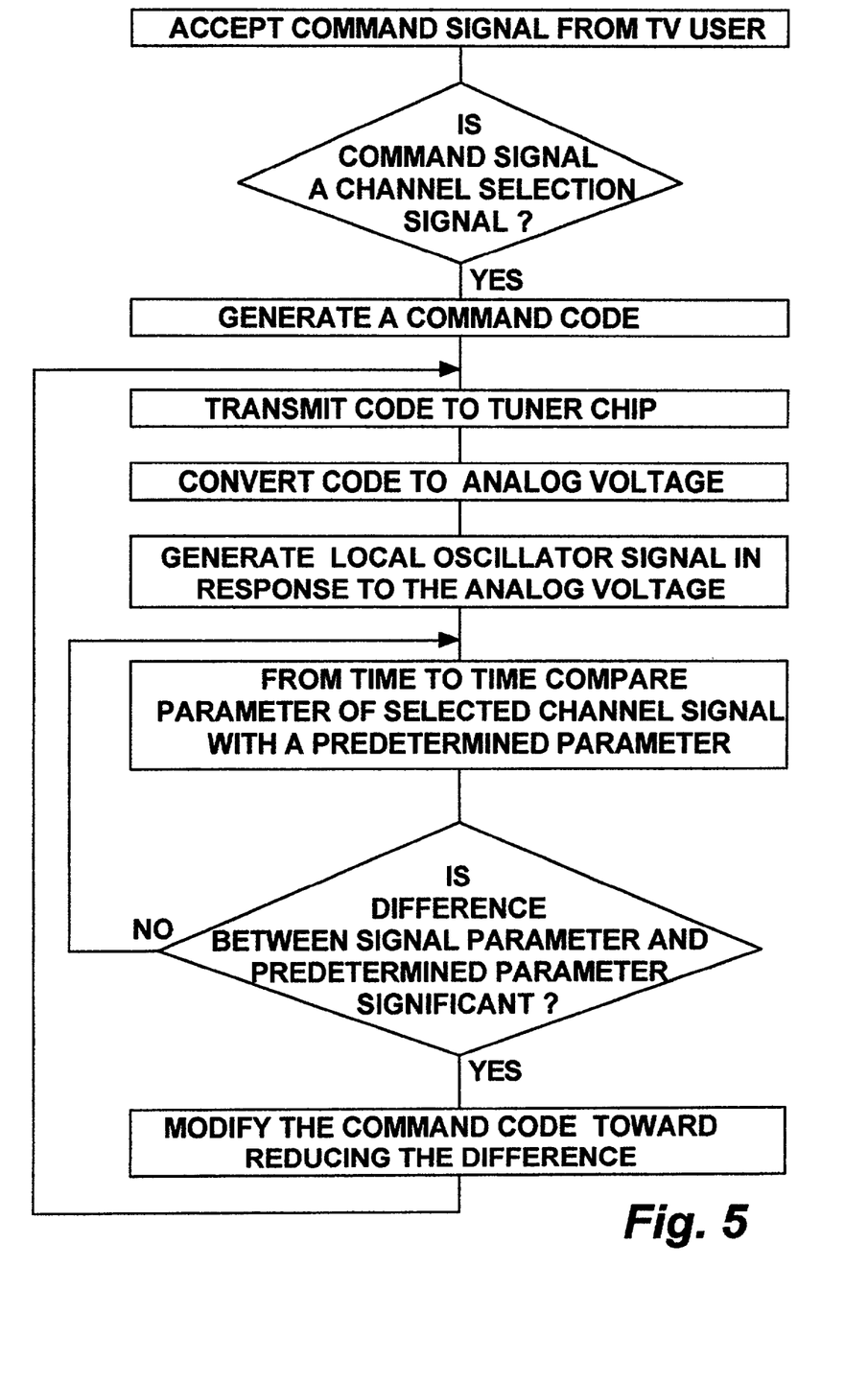
FIG. 5 is a flow chart diagram illustrating functions related to provision of a local oscillator signal in a television receiver as illustrated in FIG. 4.

In FIG. 4, a control signal for selecting the frequency of the local oscillator signal is determined in the microcomputer chip 28 by a TV processor 26b. An analog digital coder decoder 46, more typically referred to as a codec, provides digitized signal samples, via an external connection 28a, for processing by the TV processor 26b, preparatory to visible and audible presentation via TV display and sound elements 27. In this example the signal path provided via the external connection 28a is a bidirectional signal path, such that a control code for influencing the operation of an element in the tuner chip is decoded by the codec 46. Also with reference to FIG. 5, in operation the TV processor 26b is responsive to user control signals (not illustrated) such that a person is able to select a television channel for viewing. If a user control signal indicates a selected channel, it is translated into a corresponding digital control code by the TV processor 26b and transmitted via the bidirectional signal path. The codec 46 responds by converting the code into an operating control voltage for the local oscillator 48. During reception of a selected channel, the TV processor 26b compares a characteristic, of the received signal as represented by the digitized signal samples, with a preferred parameter. The characteristic of the received TV signal may be the carrier frequency or the audio subcarrier frequency, for example. The preferred parameter may be the picture frame rate for example, or some other characteristic which is independent of the effects of frequency conversion. Any significant difference is useful for amending the digital control code. From time to time the TV processor 26b transmits an amended or modified digital control code to effect fine tuning of the frequency of the local oscillator signal such that the TV receiver more optimally receives the selected channel.

One of the advantages envisaged in the architectures of the invention, relates to what might be described as the evolutionary process of integrated digital circuitry shrinkage. Historically from time to time in the integrated circuit semiconductor industry, precision of manufacture is improved to such extent that very large scale integrated (VLSI) circuits can be redesigned by using smaller elements to produce a smaller, faster, integrated circuit of improved production yield, reduced power consumption and higher profit margin. In at least one circuit technology, CMOS for example, the shrinkage can often be achieved by reducing the dimensions of the circuitry geometry by simply scaling or blowing down the production masks or masking data. This shrinkage is most economically attractive, provided the integrated circuit is exclusive of analog circuit elements. This process is not useful if applied to analog circuits. Thus it behooves tuner chip manufactures to incorporate an appropriate A/D converter circuit or codec into the tuner chip, in accordance with the invention, in order to liberate the evolution of digital TV processors from the constraint of otherwise essential analog circuit elements.

Another significant advantage of the present invention is that it supports a single stage television tuner by providing a conversion/mixer circuit operating at sufficiently high frequency to avoid mixer induced noise within the converted signal. Typically, in order to avoid such noise, an upconverted signal should have at least a frequency of half the bandwidth of the data signal. Thus, for typical cable bandwidth of about 850 MHz, an upconverted signal at about 500 MHz is desirable to account for band pass filter imperfections. In order to achieve this limit, prior art tuner circuits upconvert to about 1 GHz and then downconvert to about 45 MHz. This requires two conversion processes. Of course, since each conversion process is an analog circuit operating at high frequency and implemented in integrated circuit component(s) the resulting cost is increased as is the complexity of the overall circuit. Further, the current limitation of 43.75 MHz for the output television signal is restricting in some ways on available features and functions of the television tuner itself. Therefore, eliminating this limitation is advantageous for other reasons as well.

Alternatively, a microprocessor or a microcontroller is included for providing a control signal for controlling an integrated active LC filter, for example one with a value of greater than 100 for Q. Of course a value of Q less than 100 may be used in some applications. Typically, when using an active LC circuit, a feedback loop is used to stabilize same. That said, should a more stable LC circuit exist or be developed, it will obviate a need for dynamic stabilization in some applications.

Alternatively, a microprocessor or a microcontroller is included for providing a control signal for controlling a tracking filter.

Of course, once a microcontroller type circuit is integrated within the tuner, configurability of the tuner is optionally enhanced. For example, the tuner is useful in providing several configurable or selectable modes of operation. For example, mode selection between performance, power conservation, minimized functionality, or any level of compromise therebetween is supportable.

Accordingly, a mode supporting full functionality with high quality and maximum power consumption is selectable. Such a mode of operation is typically selected when power is available from a power grid. Of course, optionally a user is provided a facility to select the performance mode even absent connection to a power grid. Another mode of operation for use, typically, during a power outage, provides minimum functions such as bidirectional communication functions with reduced quality to maximize battery life. Yet another mode of operation supports battery operation of a mobile device wherein quality and performance are each set to a level to provide a desired level of performance to power consumption—battery life.

Alternatively, the processor adjusts the performance and power consumption levels based on the function undertaken. For example, a music channel—only music—could be "watched" using a lower performance mode of operation than an audio/visual television channel.

Other examples and variations within the spirit and scope of the invention as defined in the appended claims will become apparent to persons of skill in any of the related arts in view of the forgoing description.

What is claimed is:

1. A front end tuner for receiving modulated signals and selecting therefrom modulated signals in accordance with a frequency characteristic thereof and providing an output signal including information representative of said selected signals, comprising:

an output port coupled to the frequency conversion circuit for receiving an analogue signal about a centre frequency signal and for providing the analogue signal at the output port;

a frequency conversion circuit including a mixer for beating a local oscillator signal with signals within a predetermined band of frequencies to generate signals having frequencies within a predetermined channel band of frequencies and being representative of said selected signals and an oscillator for providing a signal having a frequency of between 40 MHz and 50 MHz and wherein the frequency conversion circuit is for providing the analogue signal about a centre frequency signal of between 40 and 50 MHz;

a signal converter circuit for receiving the signals having frequencies within the channel band of frequencies from the frequency conversion circuit and generating digitally encoded signal representations of the received signals;

the frequency conversion circuit and the signal converter circuit being in a form of an integrated circuit within a semiconductor substrate, the integrated circuit being connected with a first external terminal for receiving the signals within said predetermined band of frequencies, and being connected with a second external terminal for transmitting said digitally encoded signal representations.

2. An integrated front end tuner as defined in claim 1, wherein the frequency conversion circuit comprises a first frequency converter for providing a signal to the signal converter and a second frequency converter for in conjunction with the oscillator providing the analogue signal about a centre frequency signal of between 40 and 50 MHz.

3. An integrated front end tuner as defined in claim 1, wherein the signal converter circuit comprises an analog to digital (A/D) converter.

4. An integrated front end tuner as defined in claim 1, wherein the signal converter circuit comprises a codec.

5. An integrated front end tuner as defined in claim 1, further comprising:

a decoder for converting a coded selection signal to provide a variable voltage signal of a corresponding voltage value; and a local oscillator for generating the local oscillator signal at a frequency being controlled by the voltage value.

6. An integrated front end tuner as defined in claim 1, comprising a controller for selectably controlling the integrated front end tuner in one of a plurality of different modes of operation.

7. An integrated front end tuner as defined in claim 6, comprising a controller input port for receiving a control signal to selectably vary the one of a plurality of different modes of operation.

8. An integrated front end tuner as defined in claim 7, wherein the controller comprises colour-correction circuitry for adjusting portions of the digitally encoded signal representations representative of colours in dependence upon the control signal in one of a plurality of different modes of operation.

9. An integrated front end tuner as defined in claim 7, wherein the controller comprises sound-correction circuitry for adjusting portions of the digitally encoded signal representations representative of sounds in dependence upon the control signal in one of a plurality of different modes of operation.

10. An integrated front end tuner as defined in claim 6, wherein the controller is responsive to a received signal and data provided thereto relating to a signal portion of interest.

11. An integrated front end tuner as defined in claim 6, wherein the controller is responsive to selection data provided thereto.

12. An integrated front end tuner as defined in claim 11, wherein the controller is for selecting a mode of operation in response to the selection data provided thereto by an individual operating the front end tuner.

13. An integrated front end tuner as defined in claim 6, wherein the controller is responsive external parameters.

14. A front end tuner for receiving modulated signals and selecting therefrom modulated signals in accordance with a frequency characteristic thereof and providing an output signal including information representative of said selected signals, comprising:
a frequency conversion circuit including a mixer for beating a local oscillator signal with signals within a predetermined band of frequencies to generate signals having frequencies within a predetermined channel band of frequencies and being representative of said selected signals;
a signal converter circuit for receiving the signals having frequencies within the channel band of frequencies from the frequency conversion circuit and generating digitally encoded signal representations of the received signals;
the frequency conversion circuit and the signal converter circuit being in a form of an integrated circuit within a semiconductor substrate, the integrated circuit being connected with a first external terminal for receiving the signals within said predetermined band of frequencies, and being connected with a second external terminal for transmitting said digitally encoded signal representations, wherein the frequency conversion circuit is coupled with a third external terminal for receiving the local oscillator signal and the signal converter circuit is an analog to digital converter.

15. A front end tuner for receiving modulated signals and selecting therefrom modulated signals in accordance with a frequency characteristic thereof and providing an output signal including information representative of said selected signals, comprising:
a frequency conversion circuit including a mixer for beating a local oscillator signal with signals within a predetermined band of frequencies to generate signals having frequencies within a predetermined channel band of frequencies and being representative of said selected signals;
a signal converter circuit for receiving the signals having frequencies within the channel band of frequencies from the frequency conversion circuit and generating digitally encoded signal representations of the received signals;
the frequency conversion circuit and the signal converter circuit being in a form of an integrated circuit within a semiconductor substrate, the integrated circuit being connected with a first external terminal for receiving the signals within said predetermined band of frequencies, and being connected with a second external terminal for transmitting said digitally encoded signal representations, wherein the signal converter circuit comprises an analog to digital (A/D) converter,
wherein the signal converter circuit is a codec, said codec having a bidirectional digital signals input/output coupled with the second external terminal for receiving a coded signal and converting the coded signal to provide a variable voltage signal of a corresponding voltage value; and the integrated front end tuner further comprising:
a local oscillator for generating the local oscillator signal at a frequency being controlled by the voltage value.

16. A front end tuner for receiving modulated signals and selecting therefrom modulated signals in accordance with a frequency characteristic thereof and providing an output signal including information representative of said selected signals, comprising:
a frequency conversion circuit including a mixer for beating a local oscillator signal with signals within a predetermined band of frequencies to generate signals having frequencies within a predetermined channel band of frequencies and being representative of said selected signals;
a signal converter circuit for receiving the signals having frequencies within the channel band of frequencies from the frequency conversion circuit and generating digitally encoded signal representations of the received signals;
a controller for selectably controlling the integrated front end tuner in one of a plurality of different modes of operation;
the frequency conversion circuit and the signal converter circuit being in a form of an integrated circuit within a semiconductor substrate, the integrated circuit being connected with a first external terminal for receiving the signals within said predetermined band of frequencies, and being connected with a second external terminal for transmitting said digitally encoded signal representations, wherein the plurality of different modes of operation includes a power saving mode, a performance mode, and a limited functionality mode.

17. A front end tuner for receiving modulated signals and selecting therefrom modulated signals in accordance with a frequency characteristic thereof and providing an output signal including information representative of said selected signals, comprising:
a frequency conversion circuit including a mixer for beating a local oscillator signal with signals within a predetermined band of frequencies to generate signals having frequencies within a predetermined channel band of frequencies and being representative of said selected signals;
a signal converter circuit for receiving the signals having frequencies within the channel band of frequencies from the frequency conversion circuit and generating digitally encoded signal representations of the received signals;

a controller responsive to external parameters for selectably controlling the integrated front end tuner in one of a plurality of different modes of operation;

the frequency conversion circuit and the signal converter circuit being in a form of an integrated circuit within a semiconductor substrate, the integrated circuit being connected with a first external terminal for receiving the signals within said predetermined band of frequencies, and being connected with a second external terminal for transmitting said digitally encoded signal representations, wherein the external parameter is power and wherein the controller is for changing a mode of operation of the front end tuner in response to a change in a power profile of power provided thereto.

18. A receiver for receiving program information having been modulated on a carrier signal of a frequency within a predetermined range of frequencies, comprising:

a plurality of filter devices including a first filter having a pass band for passing signals of frequencies within the predetermined range of frequencies with lesser attenuation than signals of other frequencies, and a second filter having a pass band limited to a channel range of frequencies consistent with passing information signals representative of said modulated carrier signal;

a frequency conversion circuit including a mixer for beating a local signal with signals passed by the first filter to generate signals being representative of said modulated carrier frequency signal at frequencies within the channel range of frequencies for pass filtering by the second filter;

a signal converter circuit for generating digitally encoded signal representations of any signals passed by the second filter and including a signal port for providing the digitally encoded signal representations;

at least the frequency conversion circuit and the signal converter circuit residing in a form of an integrated circuit within a semiconductor substrate and the integrated circuit being connected with an external terminal for transmitting the digitally encoded signal representations; and, a TV processor within a microcomputer chip, coupled to receive said digitally encoded signal representations;

TV display and sound elements coupled with the TV processor; and a frequency synthesizer having an output coupled with said integrated circuit for providing the local signal to the frequency conversion circuit, and being responsive a code from the TV processor for generating the local signal at a frequency to facilitate said pass filtering of said signals being representative of said modulated carrier frequency signal.

19. A receiver as defined in claim 18, wherein the frequency synthesizer is also within the microcomputer chip.

20. A receiver as defined in claim 18, wherein the signal converter circuit is a codec and further comprises an analog out for providing the local signal in response to coded signals, the receiver further comprising:

a TV processor coupled to receive said digitally encoded signal representations from the codec and to provide the coded signals to the codec; and TV display and sound elements coupled with the TV processor.

* * * * *